(12) United States Patent
Schubert

(10) Patent No.: US 11,201,766 B2
(45) Date of Patent: Dec. 14, 2021

(54) DETECTOR CIRCUIT AND SYSTEM FOR GALVANICALLY ISOLATED TRANSMISSION OF DIGITAL SIGNALS

(71) Applicant: Robert Bosch GmbH, Stuttgart (DE)

(72) Inventor: Andreas Schubert, Coswig (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 16/970,551

(22) PCT Filed: Mar. 27, 2019

(86) PCT No.: PCT/EP2019/057663
§ 371 (c)(1),
(2) Date: Aug. 17, 2020

(87) PCT Pub. No.: WO2019/185677
PCT Pub. Date: Oct. 3, 2019

(65) Prior Publication Data
US 2021/0119834 A1    Apr. 22, 2021

(30) Foreign Application Priority Data

Mar. 28, 2018   (DE) .......................... 102018204782.0

(51) Int. Cl.
*H04L 25/02*     (2006.01)
*H03F 3/45*      (2006.01)

(52) U.S. Cl.
CPC ..... *H04L 25/0266* (2013.01); *H03F 3/45179* (2013.01); *H04L 25/0272* (2013.01); *H03F 2203/45588* (2013.01)

(58) Field of Classification Search
CPC ............ H04L 25/0266; H04L 25/0272; H03F 3/45179; H03F 2203/45588;
(Continued)

(56) References Cited

U.S. PATENT DOCUMENTS 7,123,073 B2 * 10/2006 Nakatani ................... H03F 1/34
327/358
10,454,431 B2 * 10/2019 Sivonen ................... H03F 1/223
(Continued)

FOREIGN PATENT DOCUMENTS

WO    2006066167 A1    6/2006
WO    2016191851 A1    12/2016

OTHER PUBLICATIONS

International Search Report for PCT/EP2019/057663, dated Jul. 4, 2019.

*Primary Examiner* — Jean B Corrielus
(74) *Attorney, Agent, or Firm* — Norton Rose Fulbright US LLP; Gerard Messina

(57) ABSTRACT

A detector circuit for galvanically isolated transmission of digital signals. The detector circuit includes two differential signal inputs, one input common-mode voltage connection, one alternating voltage coupling, and one differential stage. The detector circuit also includes one operating voltage connection, one operating ground connection, one signal output, one bias current connection, and one rectifier stage. The alternating current coupling includes two capacitors and two resistors. The differential stage includes a first n-channel transistor and a second n-channel transistor. The bias current connection is connected to the differential stage via a third n-channel transistor. The bias current connection is connected to the rectifier stage via a fourth n-channel transistor and a fifth n-channel transistor. The rectifier stage includes five p-channel transistors.

6 Claims, 2 Drawing Sheets

(58) Field of Classification Search
CPC . H03F 2203/45508; H03F 2203/45398; H03F 3/45484; H03F 3/45183
See application file for complete search history.

(56) References Cited

U.S. PATENT DOCUMENTS

| | | |
|---|---|---|
| 2010/0202499 A1 | 8/2010 | Lee et al. |
| 2010/0308914 A1* | 12/2010 | Kuo .................... H03F 3/45179 330/261 |
| 2012/0212259 A1* | 8/2012 | Riva ................... H03F 3/45183 327/89 |
| 2014/0009139 A1* | 1/2014 | Oishi ...................... G05F 3/262 323/315 |
| 2016/0080182 A1 | 3/2016 | Yun et al. |
| 2018/0109256 A1* | 4/2018 | Burton ................ H03F 3/45179 |

* cited by examiner

DETECTOR CIRCUIT AND SYSTEM FOR GALVANICALLY ISOLATED TRANSMISSION OF DIGITAL SIGNALS

FIELD

The present invention relates to a detector circuit for galvanically isolated transmission of digital signals as well as a system for galvanically isolated transmission of digital signals, which includes a detector circuit of this type.

BACKGROUND INFORMATION

The need for galvanically isolated signal transmission exists for systems in which the voltages occurring between individual parts of the system may damage the system or parts thereof and thus also pose a potential danger for the user. Everyday examples of this are controllers for electronically commuted motors, switched voltage converters or synchronous rectifiers for voltages that are much higher (>500 V) than the usual voltages of up to 5 V in signal processing. The use in modern electric drives and in electrical energy transmission are progressively gaining in importance.

Different fundamental isolator principles exist in the related art.

Optical isolators have existed since the 1960s. A controllable light source—generally an LED—stimulates a light-sensitive component, which is used as the receiver. Transmitters (light source, such as an LED) and receivers (for example, a phototransistor) are galvanically isolated from each other. This concept is very simple and permits the transmission of static signals. However, it has two disadvantages from today's perspective: A full integration into silicon-based CMOS (complementary metal-oxide semiconductor) technologies is not presently possible because special semiconductor materials are necessary, and the reliability presently achievable is insufficient for applications having high quality requirements.

Magnetic isolators are generally based on the transformer principle. The transmitter couples its signal into the primary side, and the receiver couples it back out at the secondary side. Primary and secondary windings of the transformer are galvanically isolated. As a result of this principle, static signals are not directly transmittable. A reliable transmission requires a suitably modulated carrier signal. This approach may be integrated into standard CMOS technologies. Less common magnetic principles use the Hall effect or the magnetoresistive effect for a magnetic isolation. The electromagnetic isolation is a special situation, which uses integrated transformers and integrated, distributed capacitors for the galvanic isolation.

Capacitive isolators are based on the principle of alternating current coupling. A sufficiently voltage-resistant capacitor is used as the coupling element between the transmitter and the receiver. The dielectric material of the capacitor is used as the galvanic isolator between the transmitter and the receiver. Once again, a reliable transmission requires a suitably modulated carrier signal.

Most isolators must modulate the information to be transmitted onto a carrier signal if they are unable, in principle, to transmit static signals directly. The most common method is on-off keying (OOK). The carrier signal is transmitted or fully blocked, depending on the data. To ensure a robust signal transmission in the case of significant common-mode interference, the transmission link is usually provided with a differential structure. The more general amplitude shift keying (ASK) is less commonly found as the modulation method. The amplitude of the carrier is varied depending on the data, but the carrier signal does not disappear. Because ASK is less robust than OOK with respect to interference, it is only rarely used for galvanically isolated signal transmissions.

SUMMARY

According to an example embodiment of the present invention, a detector circuit is provided for the galvanically isolated transmission of digital signals, including
two differential signal inputs;
one input common-mode voltage connection;
one alternating voltage coupling;
one differential stage;
one operating voltage connection;
one operating ground connection;
one signal output;
one bias current connection; and
one rectifier stage,
the alternating voltage coupling including two capacitors and two resistors, and one capacitor being connected to a first side at one of the differential signal inputs, and the second sides of the two capacitors each being connected to the differential stage and to the input common-mode voltage connection via one resistor;
the differential stage including a first n-channel transistor and a second n-channel transistor and the first and second re-channel transistors each being connected to one resistor and one capacitor of the alternating voltage coupling;
the bias current connection being connected to the differential stage via a third n-channel transistor, and the bias current connection being connected to the rectifier stage via a fourth n-channel transistor and a fifth n-channel transistor;
the operating ground connection being connected to the third, fourth and fifth n-channel transistors;
the rectifier stage including five p-channel transistors, and the first n-channel transistor being connected to the first p-channel transistor, the fourth p-channel transistor and the fifth p-channel transistor, and the second n-channel transistor being connected to the second p-channel transistor, the fourth p-channel transistor and the fifth p-channel transistor;
the operating voltage connection being connected to the first, second and third p-channel transistors;
the signal output being connected to the fourth and fifth p-channel transistors.

The detector circuit according to the example embodiment of the present invention may output a corresponding current signal with the aid of the first applied half-wave of the carrier signal. This permits a high transmission speed, which is essentially determined by the inertia of the current comparator.

The detector circuit allows a nearly digital control of the fourth and fifth p-channel transistors of the rectifier stage, whereby the active rectification of a high-frequency signal becomes robust with respect to a mismatch within the circuit. The demodulation of an OOK signal with the aid of a downstream current comparator is also made possible without problems.

The differential stage suppresses common-mode interferences to a significant degree. This interference suppression is limited in a first approximation only by the mismatch of the first n-channel transistor and the second n-channel transistor and by the finite output resistance of the third n-channel transistor.

It is not important how the high-frequency differential signal reaches the differential signal inputs, by which the circuit according to the present invention may be used for capacitive and magnetic isolation alike.

The network belonging to the differential signal inputs, which is made up of capacitors and resistors, forms an alternating current coupling while simultaneously defining the input common-mode voltage. This coupling makes it possible to suppress a possible offset, which is caused by a mismatch in the common-mode control circuit (cf., for example, reference numeral 9 in FIG. 1) or in the galvanic isolator itself. The input common-mode voltage should be selected in such a way that common-mode interferences, i.e., parallel voltage changes at the differential signal inputs, do not under any circumstances result in a violation of the saturation conditions for the third n-channel transistor situated between the bias current connection and the differential signal inputs or for the differential stage (the first and second n-channel transistors).

In this way, the present high-frequency signal may be completely rectified and converted into a current. A downstream current comparator converts the resulting current signal into a digital signal. The information to be transmitted is thus recovered on the receiver side.

In one preferred specific embodiment of the present invention, the first p-channel transistor and the second p-channel transistor are configured in such a way that they may supply higher currents than may be tapped by the first n-channel transistor and the second n-channel transistor if no differential signal is present at the differential signal inputs. The first p-channel transistor and the second p-channel transistor may thus be operated in the linear range. The potentials of nodes situated between the rectifier stage and the differential stage are then close to operating voltage AVDD.

For example, the drain currents in the first n-channel transistor and in the second n-channel transistor may be selected to be equally high and each be double that of the current present at the bias current connection if no differential signal is present at the differential signal inputs.

In another specific embodiment of the present invention, the first n-channel transistor and the second n-channel transistor are configured in such a way that they may take up higher currents than may be supplied by the first p-channel transistor and the second p-channel transistor if a high-frequency differential signal having a sufficiently high amplitude is present at the differential signal inputs. This also ensures that the p-channel transistors may preferably be operated in the linear range.

For example, drain currents of the first p-channel transistor and the second p-channel transistor may be selected to be three times higher than the current present at the bias current connection if no differential signal is present at the differential signal inputs.

It is preferred if the drain currents in the first n-channel transistor and in the second n-channel transistor have a ratio of 3:2 with respect to the drain currents of the first p-channel transistor and the second p-channel transistor if no differential signal is present at the differential signal inputs.

It is preferred if the drain currents in the first n-channel transistor and in the second n-channel transistor have a ratio of 3:4 with respect to the drain currents of the first p-channel transistor and the second p-channel transistor if a high-frequency differential signal having a sufficiently high amplitude is present at the differential signal inputs.

In one preferred specific embodiment of the present invention, the current from the third n-channel transistor is conducted all the way through the first n-channel transistor or the second re-channel transistor if a high-frequency differential signal having a sufficiently high amplitude is present at the differential signal inputs. The potentials of nodes situated between the rectifier stage and the differential stage are thus reduced, since the drain currents of the n-channel transistors are higher than the drain currents of the p-channel transistors.

In one preferred specific embodiment of the present invention, the fourth p-channel transistor and the fifth p-channel transistor are alternately turned on, and the unused drain current in each case is conducted from the first p-channel transistor and the second p-channel transistor to the signal output if a high-frequency differential signal having a sufficiently high amplitude is present at the differential signal inputs. In this way, the present high frequency signal is completely rectified and converted into a current on the receiver side. A downstream current comparator converts the resulting current signal into a digital signal. The information to be transmitted is thus recovered on the receiver side.

The present invention further relates to a system for the galvanically isolated transmission of digital signals, encompassing a transmitter side, which includes a transmitter encompassing an on-off keying modulator, a receiver side, which includes a current comparator, and a detector circuit according to one of the preceding specific example embodiments.

The galvanically isolated signal transmission is implemented with the aid of two integrated circuits, which, however, are situated in galvanically isolated substrates. A common-mode control circuit is then situated in parallel to the receiver circuit. It ensures that the common-mode voltage at the receiver input is always in the permissible range as long as permissible values are maintained for the potential difference and its rate of change between the transmitter and the receiver.

The receiver is made up of two parts: a detector circuit, which outputs a current signal when a differential signal is detected, and a comparator for current signals, which converts the current signal into a digital signal.

BRIEF DESCRIPTION OF THE DRAWINGS

Exemplary embodiments of the present invention are explained in greater detail based on the figures and the description below.

DETAILED DESCRIPTION OF EXAMPLE EMBODIMENTS

The present invention provides a detector circuit of a receiver for a galvanically isolated signal transmission. A preferably large number of the following requirements should be met:
  differential transmission and high common-mode and interference suppression;
  OOK modulation;
  short delay times; and
  suitability for magnetic and capacitive galvanic isolation.

Figure 1:
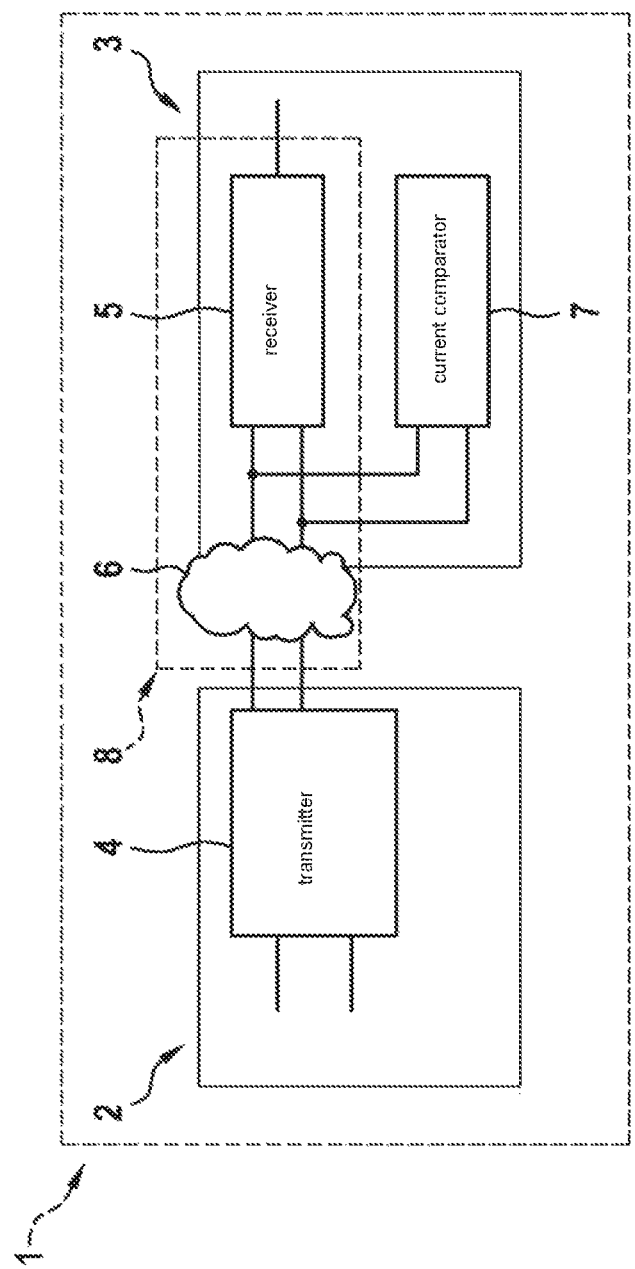
FIG. 1 shows a schematic representation of a system according to an example embodiment of the present invention.

FIG. 1 shows one specific embodiment of a system 1 according to the present invention for the galvanically isolated transmission of digital signals. System 1 encompasses a transmitter side 2, which includes a transmitter 4 encompassing an on-off keying modulator, as well as a receiver side 3, which includes a receiver 5, a current comparator 7 and a common-mode control circuit 9. Detector circuit 8 according to the present invention includes receiver 5 and a galvanic isolator 6.

Figure 2:
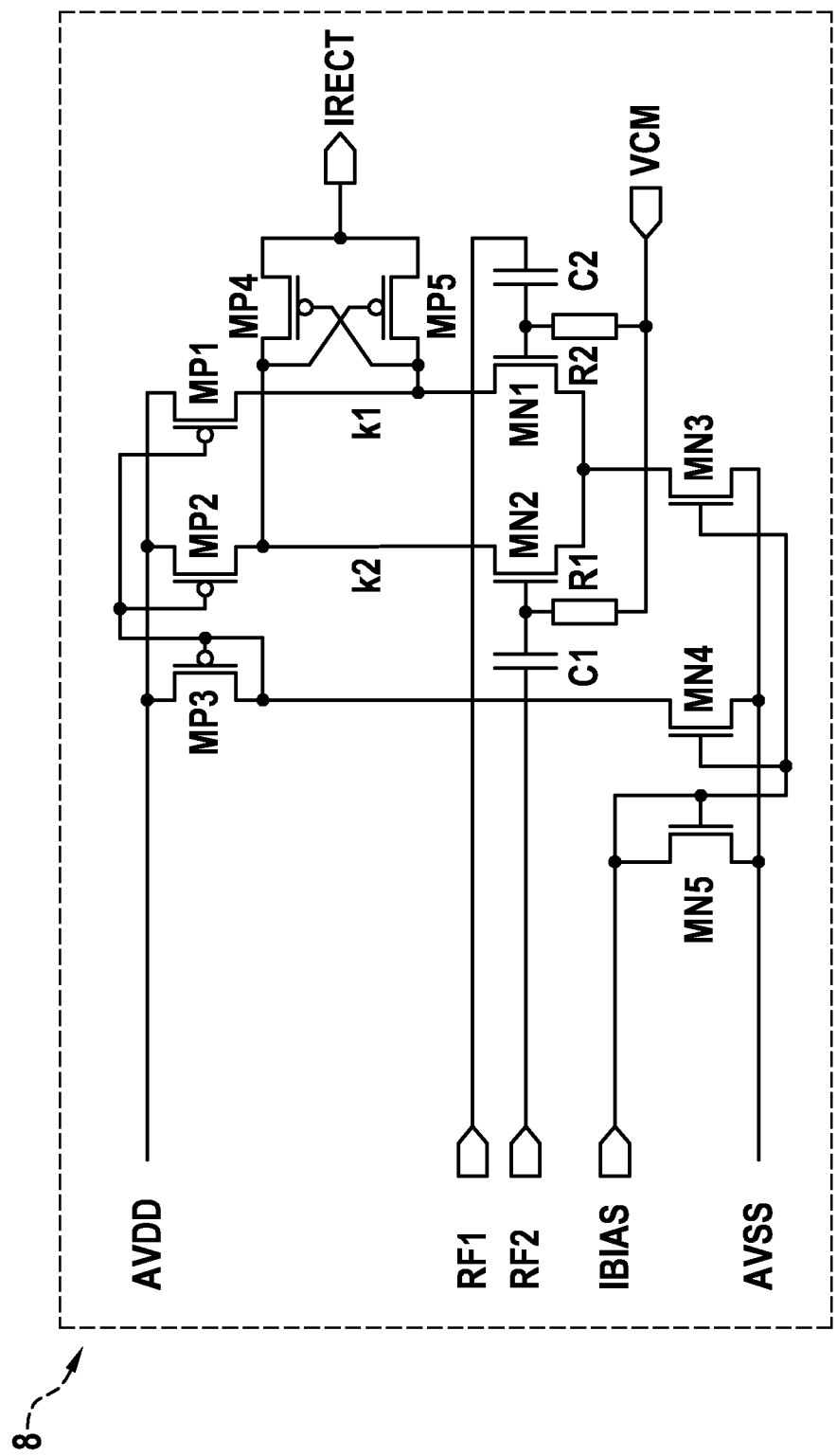
FIG. 2 shows a specific embodiment of a detector circuit according to an example embodiment of the present invention.

FIG. 2 shows one specific embodiment of a detector circuit 8 according to the present invention for galvanically isolated transmission of digital signals. The detector circuit includes two differential signal inputs RF1, RF2, one input common-mode voltage connection VCM and one alternating voltage coupling. The alternating current coupling includes two capacitors C1, C2 and two resistors R1, R2. One capacitor C1, C2 in each case is connected to one of the differential signal inputs RF1, RF2 on a first side. The second sides of the two capacitors C1, C2 are each connected to a differential stage of the detector circuit and to input common-mode voltage connection VCM via one resistor R1, R2 in each case.

Detector circuit 8 further includes one operating voltage connection AVDD, one signal output IRECT, one bias current connection IBIAS and one rectifier stage. The differential stage includes a first n-channel transistor MN1 and a second n-channel transistor MN2. First and second n-channel transistors MN1, MN2 are each connected to one resistor R1, R2 and one capacitor C1, C2 of the alternating voltage coupling.

Bias current connection IBIAS is connected to the differential stage via a third n-channel transistor MN3. Bias current connection IBIAS is connected to the rectifier stage via a fourth n-channel transistor MN4 and a fifth n-channel transistor MN5.

An operating ground connection AVSS is connected to third, fourth and fifth n-channel transistors MN3, MN4, MN5.

The rectifier stage includes five p-channel transistors MP1, MP2, MP3, MP4, MP5. First n-channel transistor MN1 is connected to first p-channel transistor MP1, fourth p-channel transistor MP4 and fifth p-channel transistor MP5. Second n-channel transistor MN2 is connected to second p-channel transistor MP2, fourth p-channel transistor MP4 and fifth p-channel transistor MP5.

Operating voltage connection AVDD is connected to first, second and third p-channel transistors MP1, MP2, MP3.

Signal output IRECT is connected to fourth and fifth p-channel transistors MP4, MP5.

The drain currents in first n-channel transistor MN1 and in second n-channel transistor MN2 are equally high and each are double that of the current present at bias current connection IBIAS ($I_{DS,MN1} = I_{DS,MN2} = 2\ I_{BIAS}$) if no differential signal is present at differential signal inputs RF1, RF2. The drain currents of third p-channel transistor MP3 and fourth p-channel transistor MP4 are three times as high as the current present at bias current connection IBIAS ($I_{DS,MP3} = I_{DS,MP4} = 3$) if no differential signal is present at differential signal inputs RF1, RF2.

The current from third n-channel transistor MN3 (IDS, MN3=4 IBIAS) is conducted all the way through first n-channel transistor MN1 or second n-channel transistor MN2 if a high-frequency differential signal having a sufficiently high amplitude is present at differential signal inputs RF1, RF2. The corresponding potential at node k1 or k2 of detector circuit 8 is then temporarily reduced, since the drain currents of the re-channel transistors are higher than the drain currents of the p-channel transistors ($I_{DS,MNx} > I_{DS,MPx}$, x=1, 2).

Fourth p-channel transistor MP4 and fifth p-channel transistor MP5 are alternately turned on, and the unused drain current in each case is conducted from first p-channel transistor MP1 and second p-channel transistor MP2 to signal output IRECT if a high-frequency differential signal having a sufficiently high amplitude is present at differential signal inputs RF1, RF2.

In particular, the following four advantages may result due to the approach according to the present invention:

1. The example detector circuit 8 outputs a corresponding current signal with the aid of the first applied half-wave of the carrier signal. This permits a high transmission speed, which is essentially determined by the inertia of current comparator 7.

2. Due to the nearly digital control of fourth p-channel transistor MP4 and fifth p-channel transistor MP5, the active rectification of the high-frequency signal becomes more robust with respect to a mismatch within detector circuit 8 and permits without problems the demodulation of an OOK signal with the aid of downstream current comparator 7.

3. The differential stage suppresses common-mode interferences to a significant degree. This interference suppression is limited in a first approximation only by the mismatch between first n-channel transistor MN1 and second n-channel transistor MN2 and by the finite output resistance of third n-channel transistor MN3.

4. It is not important how the high frequency differential signal reaches differential signal inputs RF1, RF2, whereby receiver 5 may be used for capacitive and magnetic isolation alike.

In particular, advantages 2 and 3 set the approach according to the present invention apart from those of the related art.

What is claimed is:

1. A detector circuit, comprising:
    two differential signal inputs;
    an input common-mode voltage connection;
    an alternating voltage coupling;
    a differential stage;
    an operating voltage connection;
    an operating ground connection;
    a signal output;
    a bias current connection; and
    a rectifier stage;
    wherein the alternating voltage coupling includes two capacitors and two resistors, and respective one of the two capacitors being connected to a respective one of the two differential signal inputs, and the two capacitors each being further connected to the differential stage and to the input common-mode voltage connection via the two resistors;
    wherein the differential stage including a first n-channel transistor and a second n-channel transistor, and the first n-channel transistor and the second n-channel transistor each being connected to the respective one of the two resistors of the alternating voltage coupling and the respective one of the two capacitors of the alternating voltage coupling;
    wherein the bias current connection is connected to the differential stage via a third n-channel transistor, and the bias current connection being connected to the rectifier stage via a fourth n-channel transistor and a fifth n-channel transistor;

wherein the operating ground connection is connected to the third n-channel transistor, the fourth n-channel transistor, and the fifth n-channel transistor;

wherein the rectifier stage includes five p-channel transistors, the first n-channel transistor being connected to a first one of the five p-channel transistors, a fourth one of the five p-channel transistors and a fifth one of the five p-channel transistors, and the second n-channel transistor being connected to a second one of the five p-channel transistors, the fourth one of the p-channel transistors and the fifth one of the five p-channel transistors;

wherein the operating voltage connection is connected to the first one of the five p-channel transistors, the second one of the five p-channel transistors, and a third one of the five p-channel transistors; and wherein the signal output is connected to the fourth one of the five p-channel transistors and the fifth one of the five p-channel transistors.

2. The detector circuit as recited in claim 1, wherein the first one of the five p-channel transistors and the second one of the five p-channel transistors are configured in such a way that they supply higher currents than that which are taken up by the first n-channel transistor and the second n-channel transistor when no differential signal is present at the differential signal inputs.

3. The detector circuit as recited in claim 1, wherein the first n-channel transistor and the second n-channel transistor are configured in such a way that they take up higher currents than that which are supplied by the first one of the five p-channel transistors and the second one of the five p-channel transistors when a high frequency differential signal having an amplitude above a threshold is present at the differential signal inputs.

4. The detector circuit as recited in claim 1, wherein a drain current from the third n-channel transistor is conducted all the way through the first n-channel transistor or the second n-channel transistor when a high frequency differential signal having an amplitude above a threshold is present at the differential signal inputs.

5. The detector circuit as recited in claim 4, wherein the fourth one of the five p-channel transistors and the fifth one of the five p-channel transistors are alternately turned on, and unused drain current in each case is conducted from the first one of the five p-channel transistors and the second one of the five p-channel transistors to the signal output when a high frequency differential signal having an amplitude above a threshold is present at the differential signal inputs.

6. A system, comprising:
a transmitter side which includes a transmitter encompassing an on-off keying modulator;
a galvanic isolator joined to the transmitter; and
a receiver side joined to the galvanic isolator and which includes a current comparator, a common-mode control circuit, and a detector circuit connected to the current comparator and the common-mode control circuit, the detector circuit including:
two differential signal inputs;
an input common-mode voltage connection;
an alternating voltage coupling;
a differential stage;
an operating voltage connection;
an operating ground connection;
a signal output;
a bias current connection; and
a rectifier stage;
wherein the alternating voltage coupling includes two capacitors and two resistors, and respective one of the two capacitors being connected to a respective one of the two differential signal inputs, and the two capacitors each being further connected to the differential stage and to the input common-mode voltage connection via the two resistors;
wherein the differential stage including a first n-channel transistor and a second n-channel transistor, and the first n-channel transistor and the second n-channel transistor each being connected to the respective one of the two resistors of the alternating voltage coupling and the respective one of the two capacitors of the alternating voltage coupling;
wherein the bias current connection is connected to the differential stage via a third n-channel transistor, and the bias current connection being connected to the rectifier stage via a fourth n-channel transistor and a fifth n-channel transistor;
wherein the operating ground connection is connected to the third n-channel transistor, the fourth n-channel transistor, and the fifth n-channel transistor;
wherein the rectifier stage includes five p-channel transistors, the first n-channel transistor being connected to a first one of the five p-channel transistors, a fourth one of the five p-channel transistors and a fifth one of the five p-channel transistors, and the second n-channel transistor being connected to a second one of the five p-channel transistors, the fourth one of the p-channel transistors and the fifth one of the five p-channel transistors;
wherein the operating voltage connection is connected to the first one of the five p-channel transistors, the second one of the five p-channel transistors, and a third one of the five p-channel transistors; and
wherein the signal output is connected to the fourth one of the five p-channel transistors and the fifth one of the five p-channel transistors.

* * * * *